United States Patent

Corbani et al.

(10) Patent No.: US 9,312,028 B2
(45) Date of Patent: Apr. 12, 2016

(54) METHOD FOR DETECTING PERMANENT FAULTS OF AN ADDRESS DECODER OF AN ELECTRONIC MEMORY DEVICE

(71) Applicant: STMicroelectronics S.r.l., Agrate Brianza (IT)

(72) Inventors: Stefano Corbani, Pioltello (IT); Rita Zappa, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 355 days.

(21) Appl. No.: 13/669,189

(22) Filed: Nov. 5, 2012

(65) Prior Publication Data

US 2013/0114360 A1 May 9, 2013

(30) Foreign Application Priority Data

Nov. 3, 2011 (IT) ................. TO2011A1010

(51) Int. Cl.
*G11C 29/00* (2006.01)
*G11C 29/02* (2006.01)
*G11C 11/41* (2006.01)

(52) U.S. Cl.
CPC .............. *G11C 29/02* (2013.01); *G11C 29/024* (2013.01); *G11C 11/41* (2013.01)

(58) Field of Classification Search
CPC ....... G11C 29/02; G11C 29/024; G11C 11/41
USPC ............... 365/154, 201, 230.06, 230.08, 241, 365/200, 189.01, 189.07
See application file for complete search history.

(56) References Cited

U.S. PATENT DOCUMENTS

| | | | |
|---|---|---|---|
| 5,768,294 A | 6/1998 | Chen et al. | |
| 6,163,863 A * | 12/2000 | Schicht | G11C 29/40 365/201 |
| 6,457,067 B1 | 9/2002 | Byers et al. | |
| 6,718,494 B1* | 4/2004 | Jamil et al. | 714/723 |
| 2002/0199136 A1* | 12/2002 | Ku | 714/30 |
| 2003/0182607 A1* | 9/2003 | Onodera | 714/719 |
| 2006/0203567 A1* | 9/2006 | Poechmueller | G11C 29/44 365/189.07 |
| 2009/0296496 A1* | 12/2009 | Hung | G11C 29/12005 365/189.07 |

FOREIGN PATENT DOCUMENTS

EP   0084460 A2   7/1983

OTHER PUBLICATIONS

Italian Search Report for Italian Application Serial No. TO2011A001010, The Hague, May 11, 2012, 2 pages.
(Continued)

*Primary Examiner* — Tha-O H Bui
(74) *Attorney, Agent, or Firm* — Gardere Wynne Sewell LLP (57) ABSTRACT

An embodiment of a method for detecting permanent faults of an address decoder of an electronic memory device including a memory block formed by a plurality of memory cells, including the steps of: selecting an address, which identifies a selected set of memory cells; writing at the selected address a code word generated on the basis of an information word, of the selected address, and of an error-correction code; and then detecting an error within a word stored at the selected address. The method moreover includes the steps of: selecting a set of excitation addresses; writing a test word at the selected address, and then writing an excitation word at each excitation address; and next comparing the test word with a new word stored at the selected address.

19 Claims, 5 Drawing Sheets

(56) References Cited

OTHER PUBLICATIONS

Karl Thaller, and Andreas Steininger, "A Transparent Online Memory Test for Simultaneous Detection of Functional Faults and Soft Errors in Memories", IEEE Transactions on Reliability. vol. 52. No. 4., Dec. 1, 2003; IEEE Service Center, Piscataway, NJ, US, 11 pages.

Manoj Franklin, and Kewal K. Saluja, "Built-in Self-Testing of Random-Access Memories", Computer, IEEE Service Center, Los Alamitos, CA, US, vol. 23, No. 10, Oct. 1, 1990, 13 pages.

* cited by examiner

METHOD FOR DETECTING PERMANENT FAULTS OF AN ADDRESS DECODER OF AN ELECTRONIC MEMORY DEVICE

PRIORITY CLAIM

The instant application claims priority to Italian Patent Application No. TO2011A001010, filed Nov. 3, 2011, which application is incorporated herein by reference in its entirety.

TECHNICAL FIELD

An embodiment relates to a method for detecting permanent faults of an address decoder of an electronic memory device.

BACKGROUND

Figure 1:
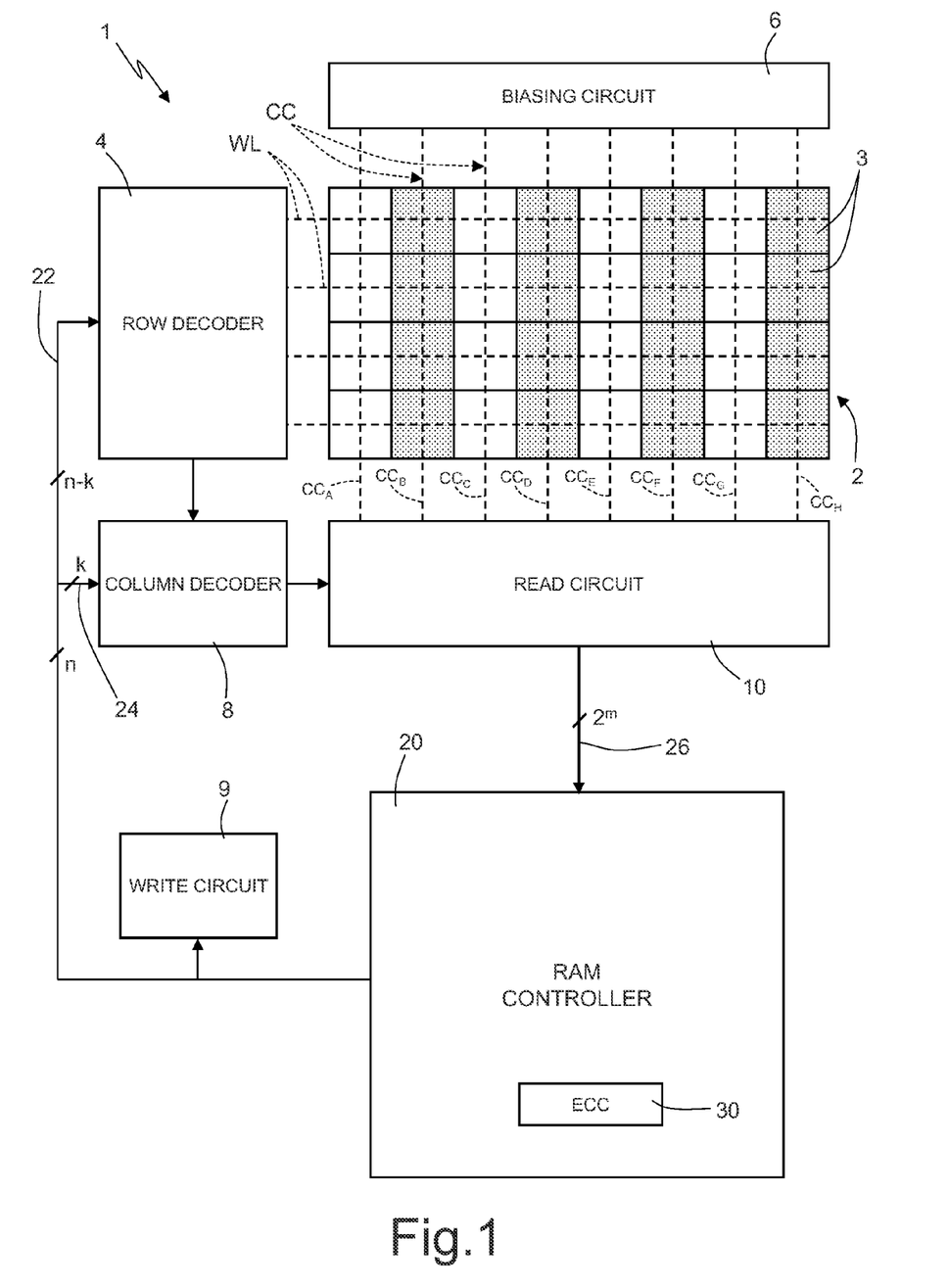
FIG. 1 shows a simplified circuit diagram of an electronic memory device of a known type.

As is shown in FIG. 1, an electronic memory device 1 includes a memory array 2 formed by a plurality of memory cells 3, which are arranged so as to define a first number N of rows and a second number M of columns. Moreover, the electronic memory device 1 includes a row decoder 4, a biasing circuit 6, a column decoder 8, a write circuit 9, and a read circuit 10, which typically include a number of amplifiers (not shown) depending on the number of columns, which are also known as "sense amplifiers".

In addition, the electronic memory device 1 includes a number of first conductive paths WL equal to the number N of rows, these first conductive paths being known as "wordlines" and being coupled to the row decoder 4. Considering a row of memory cells 3, the corresponding wordline WL is coupled to each memory cell 3 of the row considered.

In addition, the electronic memory device 1 includes a number M of conductive connections (designated as a whole by CC), which are coupled between the biasing circuit 6 and the read circuit 10. In particular, represented in FIG. 1 are a first conductive connection, a second conductive connection, a third conductive connection, a fourth conductive connection, a fifth conductive connection, a sixth conductive connection, a seventh conductive connection, and an eighth conductive connection, designated, respectively, by $CC_A$, $CC_B$, $CC_C$, $CC_D$, $CC_E$, $CC_F$, $CC_G$, and $CC_H$.

Figure 2:
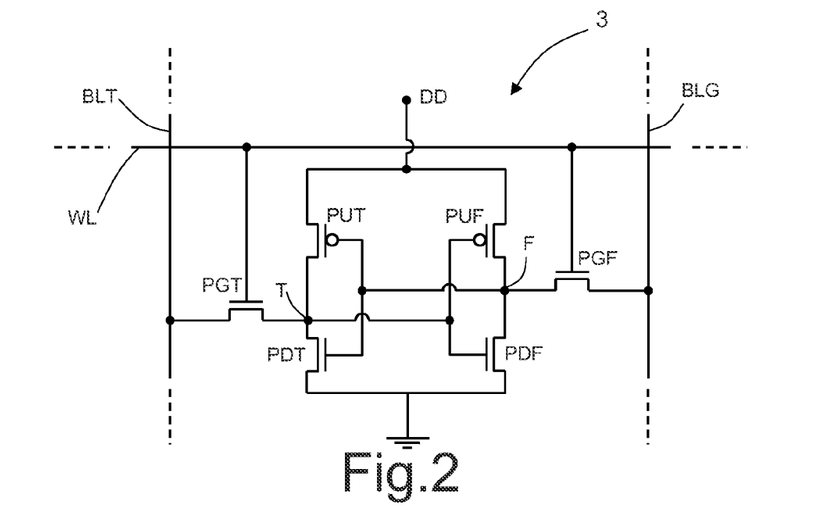
FIG. 2 shows a circuit diagram of a memory cell of a known type.

In greater detail, in the case where the memory array 2 defines a so-called "static random-access memory" (SRAM), each conductive connection CC usually includes a first bitline BLG a second bitline BLT (FIG. 2). But the memory array 2 may have another architecture.

More in particular, the electronic memory device 1 includes, for each column of memory cells 3, a corresponding first bitline BLG and a corresponding second bitline BLT, which extend between the biasing circuit 6 and the sense amplifier corresponding to the column considered. Moreover, this sense amplifier has an output terminal, which, together with the output terminals of the other sense amplifiers, defines the output of the read circuit 10. In addition, the first and second bitlines BLG, BLT are coupled to all the memory cells 3 of the column considered. Alternatively, the memory device 1 may include hierarchal bit lines (e.g., local bit lines coupled to global bit lines).

As shown in greater detail in FIG. 2, which regards once again the case where the memory cells 3 are of a six-transistor (6T) SRAM type, each memory cell 3 is formed by a first transistor PUF and a second transistor PUT, which are generally of a P-MOS type and are known as first and second "load transistors", and by a third transistor PDF and a fourth transistor PDT, which are generally of an N-MOS type and are known as first and second "pull-down transistors".

In addition, each memory cell 3 includes a fifth transistor PGF and a sixth transistor PGT, which are generally of an N-MOS type and are known as first and second "selection transistors".

In detail, the control terminal of the first load transistor PUF is coupled to the control terminal of the first pull-down transistor PDF so as to define a first node T. A first conduction terminal of the first load transistor PUF is coupled to a first conduction terminal of the first pull-down transistor PDF so as to define a second node F. A second conduction terminal of the first load transistor PUF is coupled to a third node DD, which, in use, is set at a supply voltage $V_{DD}$. A second conduction terminal of the first pull-down transistor PDF is coupled to a reference voltage such as ground.

The control terminal of the second load transistor PUT and the control terminal of the second pull-down transistor PDT are both coupled to the second node F. A first conduction terminal of the second load transistor PUT and a first conduction terminal of the second pull-down transistor PDT are both coupled to the first node T. Moreover, the second conduction terminal of the second load transistor PUT is coupled to the third node DD, whilst the second conduction terminal of the second pull-down transistor PDT is coupled to a reference voltage such as ground.

The control terminals of the first and second selection transistors PGF, PGT are both coupled to the word line WL that corresponds to the memory cell 3. The first and second conduction terminals of the first selection transistor PGF are, respectively, coupled to the second node F and to the first bitline BLG of the memory cell 3 considered. The first and second conduction terminals of the second selection transistor PGT are, respectively, coupled to the first node T and to the second bitline BLT of the memory cell 3 considered.

As is known, each memory cell 3 stores a logic value (bit), which is equal to "1" or "0". Each logic value stored corresponds to a pair of voltages of the first and second nodes T, F. For example, when the memory cell 3 stores the logic value "1", the voltage on the first node T is high (approximately, equal to the supply voltage $V_{DD}$), whereas the voltage on the second node F is low (approximately, zero); instead, when the memory cell 3 stores the logic value "0", the voltage on the first node T is low, whereas the voltage on the second node F is high. The relations between the logic values stored and the voltages on the first and second nodes T, F may in any case be reversed. However, for reasons of simplicity, in what follows it will be assumed that the logic value "1" corresponds to a high voltage on the first node T and to a low voltage on the second node F, except where otherwise specified.

Given the above, the electronic memory device 1 further includes a controller circuit 20, which is coupled to the row decoder 4 and to the column decoder 8, respectively by means of a first electrical bus 22 and a second electrical bus 24. Moreover, the controller circuit 20 is coupled to the output of the read circuit 10, by means of a third electrical bus 26, and to the write circuit 9.

Operatively, the controller circuit 20 is able to control the row decoder 4 by sending a corresponding electrical row signal on the first bus 22. This electrical row signal is of a digital type, and hence can be represented as a sequence of logic values, which form the so-called row address. When the row decoder 4 receives at input this electrical row signal, it activates one of the wordlines WL, which corresponds to the sequence of logic values represented by the electrical row signal. In general, activation of a wordline envisages that this wordline is brought to a high voltage, close to the supply voltage $V_{DD}$, the other wordlines remaining at a low voltage (e.g., zero).

Likewise, the control circuit 20 is able to control the column decoder 8 by sending a corresponding electrical column signal on the second bus 24. This electrical column signal is of a digital type, and hence can be represented as a sequence of logic values, which form the so-called column address. When the column decoder 8 receives at input this electrical column signal, it controls the read circuit 10 in such a way that the latter selects a subset of columns of the memory array 2, this subset corresponding to the column address.

In greater detail, if we designate by k the number of bits on which the column address is defined, and by n−k the number of bits on which the row address is defined, we have $N=2^{n-k}$ and $M=2^{m+k}$. Moreover, the read circuit 10 selects, on the basis of the column address, a number $2^m$ of columns of the memory array 2.

For example, with reference to the memory array 2 shown in FIG. 1, we have N=4, M=8, n=3, k=1 and m=2.

In addition, when the column address is, for example, equal to "0", the read circuit 10 selects, by means of purposely provided multiplexing circuits contained within it (not shown) and controlled by the column decoder 8, the first, third, fifth, and seventh conductive paths $CC_A$, $CC_C$, $CC_E$, and $CC_G$, i.e., the corresponding columns of the memory array 2, and hence the corresponding first and second bitlines. Likewise, when the column address is, for example, equal to "1", the read circuit 10 selects, by means of the aforementioned multiplexing circuits, the second, fourth, sixth, and eighth conductive paths $CC_B$, $CC_D$, $CC_F$, and $CC_H$, i.e., the corresponding columns of the memory array 2, and hence the corresponding first and second bitlines.

In practice, since just one wordline WL at a time can be active, on the output of the read circuit 10 a word is present, i.e., a set of $2^m$ bit (in the case in point, four bits), formed alternatively:

in the case where the column address is equal to "0", by the logic values stored in the memory cells of the first, third, fifth, and seventh column of the memory array 2 that are coupled to the active wordline; or else, in the case where the column address is equal to "1", by the logic values stored in the memory cells of the second, fourth, sixth, and eighth column of the memory array 2 that are coupled to the active wordline.

In other words, the memory array 2 corresponds to an equivalent array formed by $2^n$ rows and by $2^t$ columns, which could be addressed without resorting to a column decoder, since each row would contain exclusively the bits of a corresponding word. As compared to this equivalent array, the memory array 2 presents the advantage that, considering a generic row, adjacent memory cells do not belong to one and the same word, and hence cannot be selected simultaneously by the read circuit 10. Consequently, any possible faults that involve two contiguous memory cells can cause single errors in the corresponding words, but not multiple errors.

Figure 3:
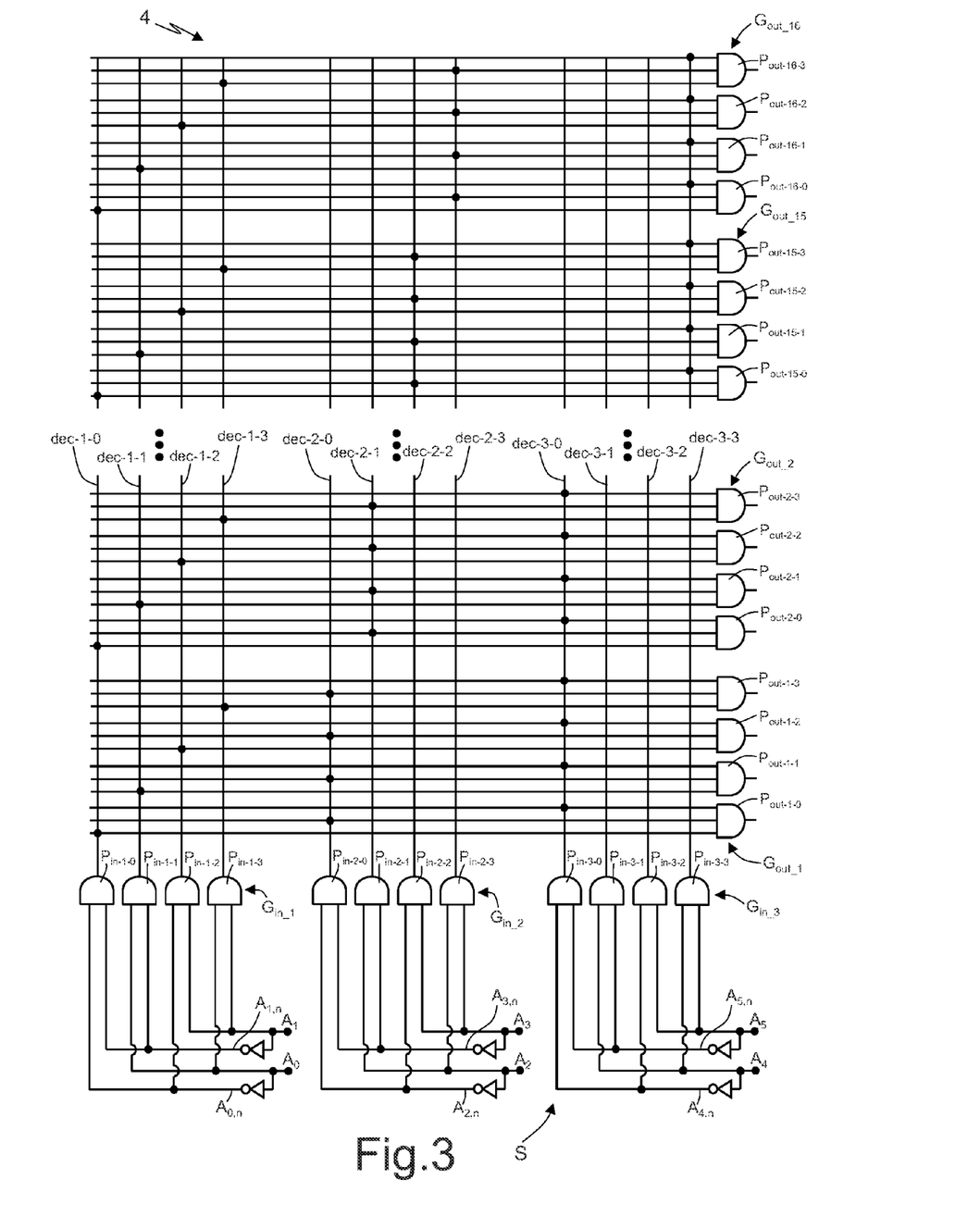
FIG. 3 shows a circuit diagram of an address decoder of a known type.

More in particular, in order to prevent the need for resorting to logic circuits with a high number of inputs, the selection of the rows and columns of the memory array 2 does not take place in a single step. In fact, with reference, for example, to the selection of the rows, the row decoder 4 is typically of the so-called "$N_{in}$ to $N_{out}$" type, with $N_{in}$ and $N_{out}$ respectively equal, for example, to two and four, or else to three and eight, as shown in FIG. 3, with particular reference to the "two to four" case.

In detail, the row decoder 4 includes a number of inputs equal to n−k, which are coupled to the controller circuit 20 by means of the first electrical bus 22. Purely by way of example, shown in FIG. 3 are a first input, a second input, a third input, a fourth input, a fifth input, and a sixth input, designated by $A_0$-$A_5$. In addition, the row decoder 4 includes a number of outputs equal to $2^{n-k}$.

In practice, the inputs of the row decoder 4 are coupled to the controller circuit 20, which, whenever it generates a row address, generates, on each input of the row decoder 4, a corresponding row-bit signal, indicating a corresponding bit of the row address. As a whole, the row-bit signals form the electrical row signal. In general, the row address and the column address can be provided to the controller circuit 20 by an external processing unit (not shown).

The row decoder 4 further includes a logic inverter for each input. With reference to FIG. 3, six inverters $I_0$-$I_5$ are hence present, each of which is coupled to a corresponding input from among the first, second, third, fourth, fifth, and sixth inputs $A_0$-$A_5$; consequently, the outputs of the logic inverters $I_0$-$I_5$ define, respectively, a first negated input, a second negated input, a third negated input, a fourth negated input, a fifth negated input, and a sixth negated input $A_{0,n}$-$A_{5,n}$.

In greater detail, the row decoder 4 further includes a plurality of input groups, each input group including four input logic gates, the latter being AND logic gates. In particular, in the example shown in FIG. 3, three input groups are present, designated respectively by $G_{in\_1}$-$G_{in\_3}$. Furthermore, considering i-th input group $G_{in\_i}$ (with 1≤i≤3), the first, second, third, and fourth input logic gates of this input group are designated, respectively, by $P_{in-i-0}$-$P_{in-i-3}$.

Considering once again the i-th input group $G_{in\_i}$:

the first logic gate $P_{in-i-0}$ is coupled to the i-1-th negated input $A_{i-1,n}$ and to the i-th negated input $A_{i,n}$;

the second logic gate $P_{in-i-2}$ is coupled to the i-1-th input $A_{i-1}$ and to the i-th negated input $A_{i,n}$; and the third logic gate $P_{in-i-2}$ is coupled to the i-1-th negated input $A_{i-1,n}$ and to the i-th input $A_i$; and the fourth logic gate $P_{in-i-3}$ is coupled to the i-1-th input $A_{i-1}$ and to the i-th input $A_i$.

In addition, considering the i-th input group $G_{in\_i}$, the output of the j-th (with 0≤j≤3) input logic gate is coupled to an intermediate line dec-i-j, also known as decoding line dec-i-j. Consequently, each input group is coupled to a corresponding group of intermediate lines dec-i-j.

The row decoder 4 further includes a plurality of output groups, each output group including four output logic gates, the latter being AND logic gates. In particular, in the example shown in FIG. 3, sixteen output groups are present, designated, respectively, by $G_{out\_1}$-$G_{out\_16}$ (shown in FIG. 3 are just the output groups $G_{out\_1}$, $G_{out\_2}$, $G_{out\_15}$ and $G_{out\_6}$). Furthermore, considering the h-th output group $G_{out\_h}$ (with 1≤h≤16), the first, second, third, and fourth output logic gates of this output group are designated, respectively, by $P_{out-h-0}$-$P_{out-h-3}$.

In detail, each output logic gate has a number of inputs equal to the number of input groups. In the example shown in FIG. 3, each output logic gate hence has a number of inputs equal to three. In addition, considering a generic output logic gate of the generic h-th output group, and designating by Num_Gin the number total of input groups, each input of the output logic gate is coupled to a corresponding intermediate line. In particular, each of these inputs is coupled to an intermediate line of a corresponding input group in such a way that there cannot be two inputs of the output logic gate that are coupled to two intermediate lines coming from one and the same input group, i.e., to two intermediate lines of one and the same group of intermediate lines.

Still more in particular, given any input group belonging to a subset S of input groups formed by all the input groups except one (in the example shown in FIG. 3, except the first input group $G_{in\_1}$), each of the output logic gates of the h-th output group has an input of its own coupled to one and the same intermediate line coming from this any input group. In addition, as regards the input group not belonging to the subset S of input groups, which can be referred to also as to local-addressing group, each of the output logic gates of the h-th output group has an input of its own coupled to a corresponding intermediate line coming from the local-addressing group. In practice, the output logic gates of the h-th output group share a number of inputs equal to Num_Gin-1, whilst each of them is coupled to the local-addressing group thanks to the coupling of an input of its own with a different intermediate line coming from the local-addressing group.

In practice, the connections between the output logic gates and the subset S of input groups enable individual selection of the output groups, whilst the connections between the output logic gates and the local-addressing group enable discrimination, within a single output group, between the output logic gates of this output group.

The outputs of the output logic gates are each coupled to a corresponding wordline WL. Consequently, for each n–k-tuple of row-bit signals generated by the controller circuit 20, i.e., for each row address, the row decoder 4 activates, i.e., sets to a logic value "1", a single output from among the outputs of the output logic gates, i.e., a single wordline.

This being said, in general, the detection of the faults within electronic memory devices is entrusted to the use of the so-called "error-correction codes" (ECCs). More in particular, the error-correction codes perform the function of guaranteeing a certain tolerance in regard to transient errors.

Figure 4:
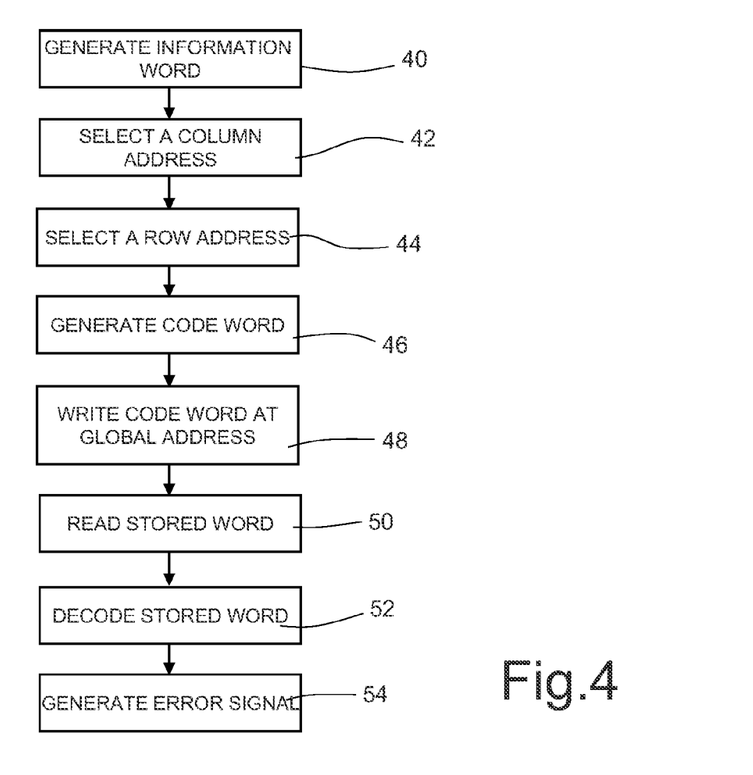
FIG. 4 shows a flowchart of operations performed by an error-correction-code module.

In practice, the controller circuit 20, in addition to generating column and row addresses, and further electrical signals designed to control the operations of reading and writing of the memory array 2, is provided with an ECC module 30, which operates as shown in FIG. 4. On the other hand, the ECC module can also be external to the electronic memory device 1.

In detail, the ECC module 30 generates (block 40) an information word, formed by a number $2^z$ of bits, with z<m. Next, the ECC module 30 selects a row address and a column address (blocks 42 and 44).

Next, the ECC module 30 generates (block 46) a code word, on the basis of the information word and of a global address formed by the row and column addresses selected. In particular, the code word is formed by $2^m$ bits and is obtained by using an encoding according to an error-correction code, such as for example a Hamming code $(n+2^m+c, n+2^m, d)$ with c=redundancy bits and d=Hamming distance.

The ECC module hence performs (block 48) a write cycle, controlling the write circuit 9 and the row and column decoders 4, 8 so as to write the code word in the memory array 2. In particular, the $2^m$ bits of the code word are written in a subset of memory cells 3 of the row indicated by the row address selected, this subset being a function of the column address selected. In brief, it is common to refer to this write operation as writing of the code word at the global address. For example, with reference to FIG. 1, where k=1 and n=3, the global address occupies n bits, of which two (for example, the two most significant bits) indicate one of the four rows of the memory array 2, whilst one bit (for example, the least significant bit) discriminates between even columns and odd columns of the memory array 2. For example, in the case where the least significant bit is equal to "0", the first, third, fifth, and seventh columns are selected, whereas, in the case where the least significant bit is equal to "1", the second, fourth, sixth, and eighth columns are selected.

In practice, the information content associated with the code word is the information word, which occupies a number of bits lower than the number $2^m$ of columns of the aforementioned equivalent array.

Next, the ECC module 30 performs (block 50) a cycle of reading at the global address; i.e., it selects the $2^m$ bits stored in a subset of memory cells of the row designated by the aforementioned row address selected, this subset being a function of the aforementioned column address selected. In this way, the ECC module 30 accesses the same memory cells that it accessed during the previous step of writing of the code word, and reads a word stored therein. In general, between the operations of block 48 and the operations of block 50, other operations can be executed, such as for example operations of writing and reading at addresses different from the global address.

Next, the ECC module 30 performs (block 52) a decoding of the word stored on the basis of the error-correction code and of the global address. In this way, the ECC module 30 is able to detect and, to a certain extent, correct possible errors (i.e., erroneous bits) within the word stored. In particular, in the case where the error-correction code is of the so-called "single error correction—double error detection" (SEC/DEC) type, the ECC module 30 is able to correct a single error present in the word stored, as well as to detect, but not correct, a double error present in the word stored, as well as possibly some higher-order errors.

In general, the errors can be caused either by faults of the memory array 2, and in particular in the portion of memory array occupied by the word stored, or by faults of the row decoder 4 and/or of the column decoder 8. Consequently, the errors can be generated during storage of bits in single memory cells 3, or else during addressing, i.e., on account of incorrect accesses.

In particular, in the case of faults of the memory array 2, these can be temporary, such as, for example, in the case where a temporary flip of the bit stored in a memory cell 3 occurs. For example, after the code word has been written in the memory array 2, this bit flip can be induced by disturbance such as the impact with alpha particles or neutrons. Furthermore, this flip can be removed by means of a subsequent rewriting.

The faults of the memory array 2 may moreover be permanent, such as, for example, in the case where a memory cell stores a fixed bit, irrespective of the bits that the controller circuit 20 attempts to write in this memory cell. In this case, if this memory cell is referred to as "faulty cell", the error presents, and is hence detectable, only in the case where the bit of the code word to be stored in the faulty cell is different from the aforementioned fixed bit.

Irrespective of the temporary or permanent nature of the faults of the memory array 2, each of them generally causes not more than one error per stored word. In other words, with reference to the aforementioned stored word, a fault of the memory array 2 can cause this stored word to differ by not more than one bit from the code word written at the global address during the operations of block 48.

In particular, the likelihood of each fault of the memory array 2 causing more than one error is reduced as multiplexing increases, i.e., as the value of k increases. In fact, as the value of k increases, pairs of memory cells for one and the same code word depart from one another. In this connection, as mentioned previously, given two successive memory cells for one and the same code word, set between them is a number k of memory cells for different code words.

In the case of faults of the row decoder 4 and/or of the column decoder 8, these are typically of a permanent nature, since they are caused, in general, by couplings between adjacent conductive paths, or else by erroneous connections of the conductive paths, such as for example erroneous connections to the supply or to ground. In these cases, it happens that, given an operation of writing of a given code word at a given address (the given code word hence being a function, not only of a corresponding information word, but also of the given address), this code word is written at a different address. Consequently, during the operations of decoding of the word stored at this different address, the ECC module detects the presence of an error. In fact, in the absence of errors in the memory array, the word stored coincides with the given code word; however, it is in fact stored at an address different from the given address.

Since each fault causes incorrect accesses to the memory array 2, each fault can cause a high number of errors. Consequently, with reference once again to the code word, in the case of a fault in the row decoder 4 and/or in the column decoder 8, it is possible for the word stored to contain multiple errors. These faults can hence have very serious effects as compared to faults of the memory array 2.

Given this, in the case where the ECC module 30, following upon the operations of block 52, detects the presence of at least one error in the word stored, it generates (block 54) an error signal indicating the presence of at least one error and the possible correction of the error by the ECC module 30 itself.

In general, as mentioned previously, the implementation of error-correction codes enables detection and, in some cases, correction, of errors, whether these be due to faults of the memory array 2 or else to faults of the row decoder 4 and/or of the column decoder 8. However, the use of the error-correction codes does not enable discrimination between faults of the memory array 2 and faults of the row decoder 4 and/or of the column decoder, and in particular does not enable detection of permanent faults of an address decoder.

SUMMARY

An embodiment is a method of detecting faults that overcomes at least in part the drawbacks of the known art.

BRIEF DESCRIPTION OF THE DRAWINGS

For a better understanding of the present disclosure, embodiments thereof are now described, purely by way of non-limiting example, with reference to the attached drawings, wherein.

An embodiment is now described with reference, by way of example, to the row decoder 4 shown in FIG. 3, even though it can find application also in the case of column decoders, in which case the outputs of the output logic gates, instead of being coupled to corresponding wordlines, are coupled to corresponding multiplexers, in a way in itself known. In this connection it should be noted that, without any loss of generality, considering the i-th input group $G_{in\_i}$, which is coupled to the inputs $A_{i-1}$ and $A_i$, and defining as a partial address the integer number, the binary representation of which is provided by the pair of logic values present on the inputs $A_{i-1}$ and $A_i$, intermediate lines dec-i-j activated in the presence of partial addresses that differ by a single unit are adjacent to one another.

Figure 5:
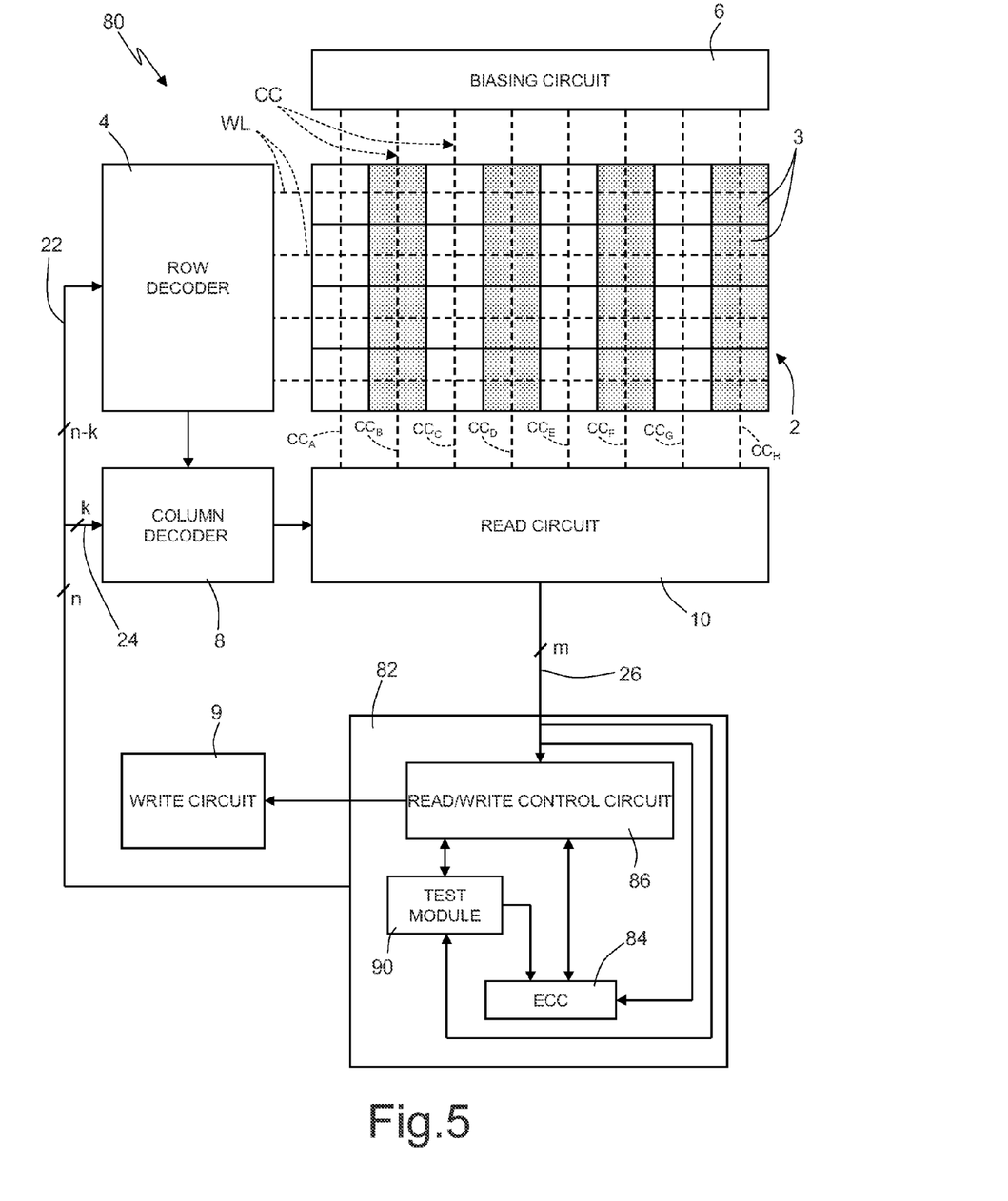
FIG. 5 shows a simplified circuit diagram of an electronic memory device according to an embodiment.

In addition, an embodiment is described with reference to the electronic memory device 80 shown in FIG. 5, in which components already shown in FIG. 1 are designated by the same reference numbers. In particular, the electronic memory device 80 includes a controller circuit 82, which includes a respective ECC module 84 and a read/write control circuit 86, in itself known, electrically coupled to the ECC module 84 and designed to generate the electrical row and column signals. The read/write control circuit 86 is moreover coupled to the output of the read circuit 10, as likewise the ECC module 84; the latter is designed for carrying out the operations of blocks 40-54 of FIG. 4.

The read/write control circuit 86 is moreover coupled to the write circuit 9 in order to enable writing of code words in the memory array 2. Operatively, in a way in itself known, the read/write control circuit 86 controls both the write circuit 9 and the read circuit 10, so as to render their operation synchronous with the generation of the row and column addresses by the read/write control circuit 86 itself.

In addition, the electronic memory device 80 includes a test module 90, for example, integrated in the controller circuit 82 and electrically coupled to the ECC module 84, to the read/write control circuit 86, and to the output of the read circuit 10. In general, the test module 90 can be external to the controller circuit 82. In addition, the test module 90 can also be external to the electronic memory device 80, in which case it can be implemented, for example, by a microprocessor or by a microcontroller of a host system, which hosts the electronic memory device 80.

Figure 6:
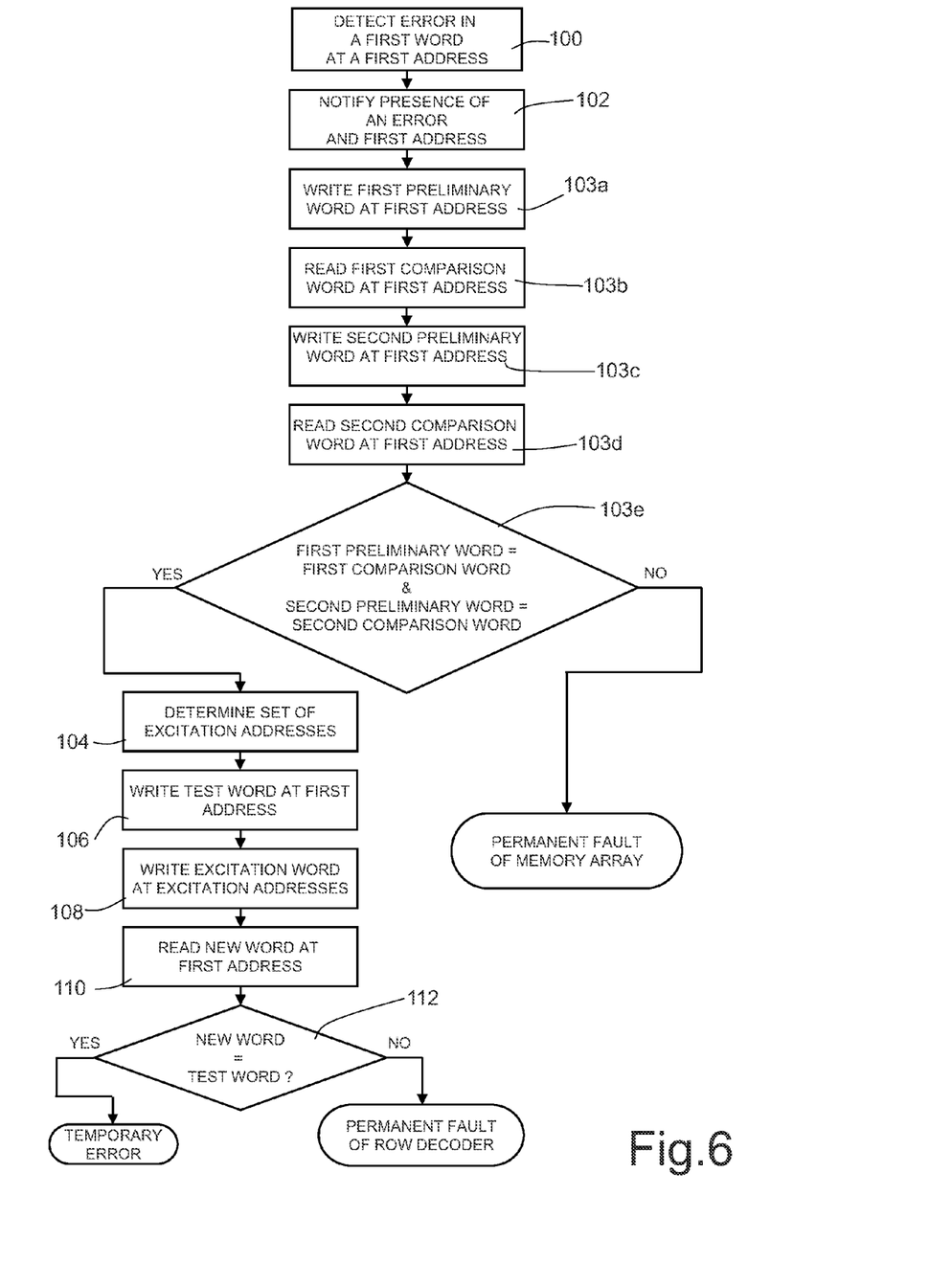
FIG. 6 shows a flowchart of operations according to an embodiment.

In detail, as shown in FIG. 6, the present method envisages that the ECC module 84 will detect (block 100) at least one error in a first word, stored in the memory array 2 at a first address. The detection of the error occurs on the basis of the error-correction code and of this first address, as described for the operations of blocks 40-54 (FIG. 4). In what follows, for reasons of brevity, the term "address" implies, except where otherwise specified, an address of a global type, i.e., one formed by a corresponding row address (on n–k bits) and by a corresponding column address (on k bits), even though an embodiment can be applied also in the case where there is no multiplexing (i.e., k=0), in which case the column decoder 8 is not present, and the first address is a row address.

For example, the aforementioned first word may have been stored during a previous write cycle, aimed at writing a corresponding code word, this corresponding code word being equal to this first word only in the absence of errors.

Next, the ECC module 84 notifies (block 102) the test module 90 of the presence of an error, as well as the first address.

The test module 90 then controls the read/write control circuit 86 in such a way that the latter will govern the write circuit 9 and the read circuit 10 so as to:

write (block 103a) a first preliminary word to the first address, this first preliminary word being chosen arbitrarily; and then read (block 103b) a first comparison word, stored at the first address;

write (block 103c) to the first address a second preliminary word, equal to the logic negation of the first preliminary word; and then read (block 103d) a second comparison word, once again stored at the first address.

Next, the test module 90 compares (block 103e) the first and second preliminary words with the first and second comparison words, respectively.

In the case where one between the first and second comparison words is different from the first and second preliminary words, respectively (output NO from block 103e), it means that we are in the presence of a permanent fault of the memory array 2.

Instead, if the first and second preliminary words are respectively equal to the first and second comparison words (output YES from block 103e) it means that we are in the presence of a temporary fault of the memory array, or else of a fault of the row decoder 4. The test module 90 then determines (block 104) a set of excitation addresses, as described hereinafter.

Next, the test module 90 controls the read/write control circuit 86 in such a way that it will govern the write circuit 9 and will generate electrical row and column signals in such a way as to write (block 106) a test word at the first address, this test word being formed by the same number of bits as the first word.

Next, the test module 90 controls the read/write control circuit 86 in such a way that it will govern the write circuit 9 and generate electrical row and column signals in such a way as to write (block 108) one and the same excitation word at each of the excitation addresses.

For example, the excitation word and the test word have the maximum possible Hamming distance; i.e., they are the logic negation of one another. For example, the test word can be formed by an alternating succession of "1" and "0", the excitation word being the logic negation thereof.

Next, the test module 90 controls the read/write control circuit 86 in a way such that it will govern the read circuit 10 and generate electrical row and column signals in such a way as to read (block 110) a new word, stored at the first address. In this way, the new word is supplied at output to the read circuit 10, and hence is supplied to the same test module 90.

Next, the test module 90 compares (block 112) the test word, written during the operations of block 106, with the new word.

In the case where the new word is equal to the test word (output YES from block 112), this means that it was a temporary fault of the memory array 2 or of the row decoder 4, since the error, detected at a first instant in time where the operations of block 100 were executed, has not come up again at a subsequent instant in time, where the operations of 110 were executed. Instead, in the case where the new word is different from the test word (output NO from block 112), it means that we are in the presence of a permanent fault of the row decoder 4.

In greater detail, according to a first embodiment, the step 104 of determining a set of excitation addresses is carried out as described hereinafter.

In general, having assumed that there is a number Num_Gin of input groups, each of which is formed by input logic gates having each a number Num_Pin of inputs, and hence having assumed that each input group is coupled to a number $Num\_LI=2^{Num\_Pin}$ of intermediate lines, each output of the output logic gates (i.e., each wordline WL) can be identified:

by a corresponding extended vector, formed by a succession of Num_Gin-tuples of Num_Pin bits, which is hence formed by Num_Gin*Num_Pin bits and is equal to the row address of the corresponding wordline; or else, equivalently by a corresponding compact vector, formed by a number Num_Gin of elements, described hereinafter.

In particular, considering an output logic gate, the corresponding compact vector identifies the Num_Gin intermediate lines to which the inputs of the output logic gate considered are coupled, these Num_Gin intermediate lines belonging, as mentioned previously, to different input groups, hence to different groups of intermediate lines. In this connection, in what follows a notation dec-i-j, i.e., a notation the same as the one used for representing the intermediate lines, will be adopted to indicate an element of the compact vector.

For example, with reference to FIG. 3, the three inputs of the output logic gate $P_{out-1-0}$ are coupled, respectively, to the intermediate lines dec-1-0, dec-2-0 and dec-3-0, hence the wordline WL coupled to the output of the output logic gate $P_{out-1-0}$ can be identified by the compact vector [dec-1-0, dec-2-0, dec-3-0], or else by the extended vector [0, 0, 0, 0, 0, 0].

In practice, each extended/compact vector is a representation of a corresponding row address. More in particular, given a wordline WL, the corresponding extended and compact vectors are representations of the row address that corresponds to the given wordline WL, i.e., the set of the bits that must be assumed by the inputs $A_0$-$A_5$ to activate the given wordline WL. In other words, there is a one-to-one correspondence between wordlines, output logic gates, and extended/compact vectors; there is hence a one-to-one correspondence between each wordline WL and a corresponding Num_Gin-tuple of intermediate lines, which are coupled to the inputs of the corresponding output logic gate and are defined by the extended/compact vector.

This being said, according to a first embodiment, if we designate by [dec-1-s1, dec-2-s2, . . . , dec-Num_Gin-sNum_Gin] the compact vector that corresponds to the row address contained in the aforementioned first address (with s1, s2, . . . , sNum_Gin included between 0 and $2^{Num\_Pin}-1$), the excitation addresses are the global addresses formed:

by the column address contained in the aforementioned first address (if present); and by the row addresses that correspond to the compact vectors [*1, dec-2-s2, . . . , dec-Num_GinsNum_Gin], [dec-1-s1, *2, . . . , dec-Num_Gin-sNum_Gin], . . . [dec-1-s1, dec-2-s2, . . . , *Num_Gin], where the elements *1, *2, . . . , *Num_Gin can be expressed as a whole by *I (with 1≤I≤Num_Gin) and are such that *I=dec-I-?, with ? equal to any one value included between 0 and $2^{Num\_Pin}-1$, but different from sI.

In practice, assuming for simplicity that there is no multiplexing, i.e., that there is no column address, and if the compact vector that corresponds to the row address contained in the aforementioned first address is referred to as the compact vector under examination, the excitation addresses are given by Num_Gin row addresses, these compact vectors differing from the compact vector under examination by just one element. In other words, the excitation addresses are row addresses that activate Num_Gin-tuples of intermediate lines that differ, each, by a single intermediate line from the Num_Gin-tuple of intermediate lines activated by the aforementioned first address. More precisely, each excitation address corresponds to a respective input group, and its own Num_Gin-tuple of intermediate lines differs from the Num_Gin-tuple of intermediate lines activated by the first address only by the intermediate line that comes under this respective input group.

By way of example, if the compact vector that corresponds to the row address contained in the aforementioned first address is [dec-1-3, dec-2-1, dec-3-1], the excitation addresses can, for example, correspond to the following compact vectors: [dec-1-2, dec-2-1, dec-3-1]; [dec-1-3, dec-2-0, dec-3-1]; and [dec-1-3, dec-2-1, dec-3-0].

In this way, it is found that, in the case where the intermediate line dec-1-3 is permanently blocked at the logic level "1", the operations of block 108 entail writing of the excitation word not only at the row addresses that correspond to the compact vectors [dec-1-2, dec-2-1, dec-3-1], [dec-1-3, dec-2-0, dec-3-1], and [dec-1-3, dec-2-1, dec-3-0], but also to the row addresses that correspond to the compact vectors [dec-1-3, dec-2-1, dec-3-1] (this vector corresponding to the row address contained in the aforementioned first address), [dec-1-3, dec-2-2, dec-3-1], and [dec-1-3, dec-2-1, dec-3-2]. Consequently, the excitation word is written also at the first address, overwriting the test word written previously. Since the excitation word and the test word are different from one another, the difference will be detected during the operations of block 112, with consequent detection of the permanent fault.

According to a different embodiment, the excitation addresses are the global addresses formed:

by the column address contained in the aforementioned first address (if present); and by the row addresses that correspond to compact vectors that differ from the compact vector under examination by just one element, this different element corresponding to an intermediate line, which belongs to the same input group to which the intermediate line indicated by the corresponding element of the vector under examination belongs, and is adjacent to the latter.

In other words, on the simplifying hypothesis of absence of multiplexing, the excitation addresses are the row addresses that correspond to Num_Gin-tuples of intermediate lines that differ, each, by a single intermediate line from the Num_Gin-tuple of intermediate lines that are activated by the aforementioned first address. Furthermore, each of these row addresses is such that, if we call "different line" the respective intermediate line that differs from the corresponding intermediate line of the Num_Gin-tuple of intermediate lines activated by the first address, this different line is adjacent to this corresponding intermediate line and belongs to the same group of intermediate lines to which this corresponding intermediate line belongs.

The number of excitation addresses is hence at the most equal to 2*Num_Gin, and drops in the case where one or more of the intermediate lines of the vector under examination are intermediate boundary lines, i.e., they are located at the edges of the respective groups of intermediate lines, and hence each of them is adjacent to a single intermediate line of the same input group.

It should be noted that, in the case where, as in the example shown in FIG. 3, intermediate lines that correspond to partial addresses that differ by a single unit are adjacent to one another, the aforementioned row addresses can be expressed, in terms of compact vectors, as [1, dec-2-s2, . . . , dec-Num_Gin-sNum_Gin], [dec-1-s1, 2, . . . , dec-Num_Gin-sNum_Gin], . . . [dec-1-s1, dec-2-s2, . . . , Num_Gin], where the elements 1, 2, . . . , Num_Gin can be expressed as a whole with I (with $1 \leq I \leq Num\_Gin$) and are such that I=dec-I-sI±1 (with **I limited between 0 and $2^{Num\_Pin}-1$).

By way of example, if the compact vector under examination is [dec-1-1, dec-2-1, dec-3-1], the excitation addresses can for example correspond to the following compact vectors: [dec-1-0, dec-2-1, dec-3-1], [dec-1-2, dec-2-1, dec-3-1], [dec-1-1, dec-2-0, dec-3-1], [dec-1-1, dec-2-2, dec-3-1], [dec-1-1, dec-2-1, dec-3-0], and [dec-1-1, dec-2-1, dec-3-2].

Once again by way of example, in FIG. 3 the intermediate boundary lines are:

in the first input group $G_{in\_1}$: $dec_{in-1-0}$ and $dec_{in-1-3}$;
in the second input group $G_{in\_2}$: $dec_{in-2-0}$ and $dec_{in-2-3}$; and
in the third input group $G_{in\_3}$: $dec_{in-3-0}$ and $dec_{in-3-3}$.

In practice, also in this case, writing of the excitation word at the excitation addresses entails, in the case of permanent fault due to a spurious coupling between two intermediate adjacent lines (for example, the intermediate lines dec-1-2 and dec-1-3), overwriting of the test word previously written at the first address, with consequent possibility of detecting the permanent fault.

The latter embodiment is hence an extension of the previous embodiment, which enables detection also of faults due to undesirable couplings between intermediate lines. In practice, according to the previous embodiment, the excitation addresses have a relation of logic closeness to the first address, whereas in the latter embodiment the excitation addresses have a relation of physical closeness to the first address.

At least some advantages that embodiments of detecting faults affords emerge clearly from the foregoing description. In particular, it enables detection of permanent faults in the row decoder 4 and/or in the column decoder 8, also in the case where they give rise to a single error in a single word stored in the memory array 2, it being possible on the other hand for this error to be corrected, in a way in itself known, thanks to the implementation of the error-correction code. In practice, the detection is obtained by writing the excitation word at the excitation addresses, which, as a whole, represent the minimum set of addresses at which it is necessary to write the excitation word in order to be certain to excite the fault again.

Finally, it is clear that modifications and variations may be made to the above-described embodiments of detecting faults, as well as to embodiments of the electronic memory device 80, without thereby departing from the scope of the present disclosure.

For example, instead of being formed by AND logic gates, the input and output groups can be formed by logic gates of a different type. For example, each AND logic gate can be replaced by a corresponding set of logic gates, such as for example a NAND logic gate followed by one or more inverters.

As previously mentioned, it is moreover possible for the ECC module 84 and/or the test module 90 to be external to the controller circuit 82.

It is likewise possible for the excitation addresses to include further addresses with respect to the addresses described.

In addition, an embodiment can be applied also in the case of an address decoder of a different type, provided that it has intermediate lines that define a sort of precoding. It is likewise possible for the words that are written in the memory array to have a dependence upon the corresponding addresses that is different from the one described.

Once again, an embodiment can have additional steps with respect to the ones described, such as for example a step of iterating, following upon the operations of block 112 (FIG. 6), the operations of blocks 106-112, but using a word different from the test word, and an excitation word equal to the logic negation of this different word. In this way, it is possible to detect faults whereby one of the wordlines WL is blocked at a low logic level, which entails the fact that at the corresponding address a pseudo-random word is stored. Writing of the test word and of the different word enables detection of the presence of a fault even in the case where this pseudo-random word is equal to the test word.

An embodiment can likewise be applied to other types of electronic memory devices, not necessarily of an SRAM type.

Also, in an embodiment, a system may be formed from the memory device 80 and a computing apparatus, such as a microprocessor or microcontroller, coupled to the memory device. The computing apparatus and memory device 80 may be disposed on a same, or on respective, integrated-circuit dies.

Furthermore, any of the above functions and/or functional blocks may be implemented in hardware, software, firmware, or a combination of one or more of hardware, software, and firmware.

Finally, an embodiment can be applied also in the case where reference is made not to a memory array, but rather to a memory block of a memory array, i.e., to a portion of a memory array, the memory cells of which are addressed by a respective row decoder and (possibly) a respective column decoder.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A test module, comprising:
an error detecting module configured to detect an error at a first memory location having an address that corresponds to portions of an address decoder;
a first submodule configured to write first test data to the first memory location in response to detection of the error;
a second submodule configured to write second test data to second memory locations having respective addresses that each correspond to a subgroup of the portions of the address decoder in response to detection of the error, the second test data different than the first test data;
a third submodule configured to read data from the first memory location after writing of the second test data by the second submodule; and
a fourth submodule configured to compare the data read by the third submodule to the first test data and indicate that a fault exists in the address decoder if the data read by the third submodule and first test data are not equal.

2. The test module of claim 1 wherein the second test data is a complement of the first test data.

3. The test module of claim 1 wherein the portions of the address decoder each include a respective logic gate.

4. The test module of claim 1 wherein the portions of the address decoder each include a respective conductive path.

5. The test module of claim 1 wherein the address decoder includes a row decoder.

6. The test module of claim 1 wherein the address decoder includes a column decoder.

7. The test module of claim 1 wherein each subgroup of the portions of the address decoder include all but one of the portions.

8. The test module of claim 1 wherein:
the portions of the address decoder each include a respective conductive path; and
each subgroup of the portions of the address decoder include all but one of the conductive paths.

9. A memory, comprising:
an array of memory locations;
an address decoder having addressing portions;
an error detecting module configured to detect an error at a first one of the memory locations having an address that corresponds to a group of the addressing portions; and
a test module, including:
a first submodule configured to write first test data to the first one of the memory locations in response to detection of the error;
a second submodule configured to write second test data to second ones of the memory locations having respective addresses that each correspond to a subgroup of the group of addressing portions in response to detection of the error, the second test data different than the first test data;
a third submodule configured to read data from the first one of the memory locations after writing of the second test data by the second submodule; and
a fourth submodule configured to compare the data read by the third submodule to the first test data and indicate that a fault exists in the address decoder if the data read by the third submodule and first test data are not equal.

10. The memory of claim 9 wherein the memory locations each include a respective SRAM cell.

11. An electronic system, comprising:
a memory, comprising:
an array of memory locations;
an address decoder having addressing portions;
an error detecting module configured to detect an error at a first one of the memory locations having an address that corresponds to a group of the addressing portions; and
a test module, including
a first submodule configured to write first test data to the first one of the memory locations in response to detection of the error,
a second submodule configured to write second test data to second ones of the memory locations having respective addresses that each correspond to a subgroup of the group of addressing portions in response to detection of the error, the second test data different than the first test data,
a third submodule configured to read data from the first one of the memory locations after writing of the second test data by the second submodule, and
a fourth submodule configured to compare the data read by the third submodule to the first test data and indicate that a fault exists in the address decoder if the data read by the third submodule and first test data are not equal; and
an integrated circuit coupled to the memory.

12. The system of claim 11 wherein the integrated circuit includes a computing apparatus.

13. The system of claim 11 wherein the memory and integrated circuit are disposed on a same die.

14. The system of claim 11 wherein the memory and integrated circuit are disposed on respective dies.

15. A method, comprising:
detecting an error at a first memory location using an error detecting module;
addressing the first memory location via selection circuitry in response to detection of the error;
writing first test data to the first memory location in response to detection of the error;

addressing each of second memory locations via a respective portion of the selection circuitry in response to detection of the error;

writing second test data to the second memory locations in response to detection of the error, the second test data different than the first test data;

reading data from the first memory location after writing of the second test data; and comparing the read data to the first test data and indicate that a fault exists in the selection circuitry if the read data and first test data are not equal.

16. The method of claim 15 wherein:

the selection circuitry includes logic gates; and each respective portion of the selection circuitry includes a respective group of one or more, but not all, of the logic gates.

17. The method of claim 15 wherein:

the selection circuitry includes conductive paths; and each respective portion for the selection circuitry includes a respective group of one or more, but not all, of the conductive paths.

18. The method of claim 15, further comprising indicating that the selection circuitry is defective if the read data does not equal the first test data.

19. A method of determining whether a fault exists within an address decoder for a memory, the method comprising:

writing a test word to a memory location of the memory associated with a portion of the address decoder by addressing the memory location using the address decoder;

reading a comparison word from the memory location by addressing the memory location using the address decoder;

detecting an undiagnosed error if the test word and comparison word are not equal; and based on detection of the undiagnosed error, writing a new test word to the memory location by addressing the memory location using the address decoder, reading a new comparison word from the memory location by addressing the memory location using the address decoder, detecting a potential fault within the address decoder if the new test word and new comparison word are not equal, and based on detection of the potential fault within the address decoder, writing a further test word to a new memory location of the memory associated with a subset of the portion of the address decoder by addressing the new memory location using the address decoder, reading a further comparison word from the new memory location by addressing the new memory location using the address decoder, and detecting a fault within the address decoder if the further test word and further comparison word are not equal.

* * * * *